United States Patent
Morikazu

(10) Patent No.: US 11,114,341 B2
(45) Date of Patent: Sep. 7, 2021

(54) LASER PROCESSING METHOD

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 32 days.

(21) Appl. No.: 16/601,077

(22) Filed: Oct. 14, 2019

(65) Prior Publication Data
US 2020/0135563 A1 Apr. 30, 2020

(30) Foreign Application Priority Data
Oct. 26, 2018 (JP) .............................. JP2018-201722

(51) Int. Cl.
| | |
|---|---|
| *H01L 21/768* | (2006.01) |
| *H01L 21/268* | (2006.01) |
| *H01L 21/66* | (2006.01) |
| *H01L 23/00* | (2006.01) |
| *B23K 26/362* | (2014.01) |

(52) U.S. Cl.
CPC ...... *H01L 21/76898* (2013.01); *B23K 26/362* (2013.01); *H01L 21/268* (2013.01); *H01L 22/26* (2013.01); *H01L 24/05* (2013.01); *H01L 2224/05025* (2013.01); *H01L 2924/40102* (2013.01); *H01L 2924/40501* (2013.01)

(58) Field of Classification Search
CPC .............. B23K 2101/42; B23K 26/362; H01L 21/76898; H01L 21/268; H01L 24/05; H01L 22/26; H01L 2924/40501; H01L 2924/40102; H01L 2224/05025
See application file for complete search history.

(56) References Cited

U.S. PATENT DOCUMENTS

2011/0240617 A1* 10/2011 Xu ................... B23K 26/00
219/121.72
2013/0288425 A1* 10/2013 Rana .................. H01L 31/0682
438/98

FOREIGN PATENT DOCUMENTS

JP 2013184213 A 9/2013

OTHER PUBLICATIONS

Abstract of CN108467664, Zhou et al (Aug. 31, 2018). (Year: 2018).*
Morikazu, Hiroshi, U.S. Appl. No. 16/600,739, filed Oct. 14, 2019.
Morikazu, Hiroshi, U.S. Appl. No. 16/599,809, filed Oct. 11, 2019.

* cited by examiner

*Primary Examiner* — Caridad Everhart
(74) *Attorney, Agent, or Firm* — Greer Burns & Crain Ltd.

(57) ABSTRACT

A laser processing method for a substrate with a device formed on a front surface thereof and including an electrode pad, the method including: a laser beam applying step of applying the laser beam to the back surface of the substrate to form a fine hole in the substrate at a position corresponding to the electrode pad; a detecting step of detecting first plasma light emitted from the substrate at the same time that the fine hole is formed in the substrate by the laser beam applied thereto, and second plasma light emitted from the electrode pad; and a laser beam irradiation finishing step of stopping application of the laser beam when the second plasma light is detected in the detecting step. A peak power density of the laser beam to be applied is set in a range from 175 GW/cm² or less to 100 GW/cm² or more.

5 Claims, 5 Drawing Sheets

FIG.6

RESULTS OF EXPERIMENTS

| PEAK POWER DENSITY (GW/cm$^2$) (PULSE ENERGY ($\mu$J)) | PROCESSING RESULTS |
|---|---|
| < EXPERIMENT 1 > 300 GW/cm$^2$ (60 $\mu$J) | POOR |
| < EXPERIMENT 2 > 250 GW/cm$^2$ (50 $\mu$J) | POOR |
| < EXPERIMENT 3 > 200 GW/cm$^2$ (40 $\mu$J) | POOR |
| < EXPERIMENT 4 > 175 GW/cm$^2$ (35 $\mu$J) | GOOD |
| < EXPERIMENT 5 > 150 GW/cm$^2$ (30 $\mu$J) | EXCELLENT |
| < EXPERIMENT 6 > 125 GW/cm$^2$ (25 $\mu$J) | EXCELLENT |
| < EXPERIMENT 7 > 100 GW/cm$^2$ (20 $\mu$J) | GOOD |
| < EXPERIMENT 8 > 75 GW/cm$^2$ (15 $\mu$J) | POOR |

ND METHOD

BACKGROUND OF THE INVENTION

Field of the Invention

The present invention relates to a laser processing method of applying a laser beam to a back surface of a substrate and forming a fine hole in the substrate, the fine hole reaching an electrode pad on the substrate.

Description of the Related Art

A plurality of devices such as integrated circuits (ICs) and large-scale integrated circuits (LSIs) are formed on a front surface of a wafer in a plurality of separate respective regions defined by a grid pattern of a plurality of crossing dividing lines. The wafer thus having the plural devices thereon is divided into individual device chips along the dividing lines by using a dicing apparatus or a laser processing apparatus. The device chip thus divided is used in various electrical equipment such as mobile phones and personal computers.

In recent years, it has been customary to form a fine hole in a substrate with such devices disposed thereon from a back surface side of the substrate, the fine hole reaching back surfaces of the electrode pads formed on the devices, then have the fine hole made into a via hole by filling up the fine hole with an electrically conductive material such as aluminum, and layer devices over and under the via holes, thereby achieving higher functionality of the devices.

In order to form a fine hole described above, the present applicant has proposed a technique for applying a laser beam to a back surface of a substrate at a position corresponding to an electrode pad on a device on the substrate to form a fine hole (see Japanese Patent No. 6034030). According to the technique disclosed in Japanese Patent No. 6034030, application of a laser beam to the back surface of the substrate with the devices formed on a front surface thereof enables determination of an arrival of the laser beam to an electrode pad by detecting a plasma light that is emitted when the laser beam is applied to the back surface of the substrate and then detecting another plasma light that is emitted when the laser beam reaches the electrode pad. As a result of determination of the arrival of the laser beam to the electrode pad, application of the laser beam is stopped without making a hole in the electrode pad.

SUMMARY OF THE INVENTION

According to the conventional technique described above, when the pulsed laser beam applied to the back surface of the substrate from the back surface side thereof reaches the electrode pad, plasma light that is inherent in a material of which the electrode pad is made is generated. Accordingly, when the plasma light inherent in the electrode pad material is detected, the laser beam can be stopped. However, in a case where the laser beam to be applied is not set properly, formation of fine holes and detection of plasma light are not properly carried out. As a result, the laser beam is excessively applied to the electrode pad, thereby causing an unintended hole to be opened in the electrode pad. As another result, a fine hole is not formed sufficiently in the first place. Thus, from the foregoing description, it has become clear that the conventional technique described above has a problem that proper formation of a fine hole is difficult.

It is therefore an object of the present invention to provide a laser processing method capable of properly forming a fine hole in a substrate by applying a laser beam to a back surface of the substrate at a position corresponding to the electrode pad on a device on the substrate from the back surface side thereof.

In accordance with an aspect of the present invention, there is provided a laser processing method for applying a laser beam to a back surface of a substrate with a device formed on a front surface thereof and including an electrode pad, to form a fine hole in the substrate that reaches the electrode pad, the method including: a laser beam applying step of applying the laser beam to the back surface of the substrate to form a fine hole in the substrate at a position corresponding to the electrode pad; a detecting step of detecting first plasma light emitted from the substrate at the same time that the fine hole is formed in the substrate by the laser beam applied thereto, and second plasma light emitted from the electrode pad; and a laser beam irradiation finishing step of stopping application of the laser beam when the second plasma light is detected in the detecting step. In the laser beam applying step, a peak power density of the laser beam to be applied is set in a range from 175 $GW/cm^2$ or less to 100 $GW/cm^2$ or more.

Preferably, in the laser beam applying step, a peak power density of the laser beam to be applied is set in a range from 150 $GW/cm^2$ or less to 125 $GW/cm^2$ or more.

According to the laser processing method of the present invention, in the laser beam applying step, the peak power density of the laser beam to be applied is set in a range from 175 $GW/cm^2$ or less to 100 $GW/cm^2$ or more. Accordingly, the plasma light that is primarily generated by application of the laser beam does not interfere with the latest plasma light that is secondarily generated when the fine hole reaches the electrode pad, and accordingly, it is possible to sufficiently detect the second plasma light, thereby eliminating a problem that an unintended hole is opened in the electrode pad.

The above and other objects, features and advantages of the present invention and the manner of realizing them will become more apparent, and the invention itself will best be understood from a study of the following description and appended claims with reference to the attached drawings depicting a preferred embodiment of the invention.

BRIEF DESCRIPTION OF THE DRAWINGS

FIG. 6 is a table indicating results of experiments conducted by the present inventors.

DETAILED DESCRIPTION OF THE PREFERRED EMBODIMENT

Figure 1:
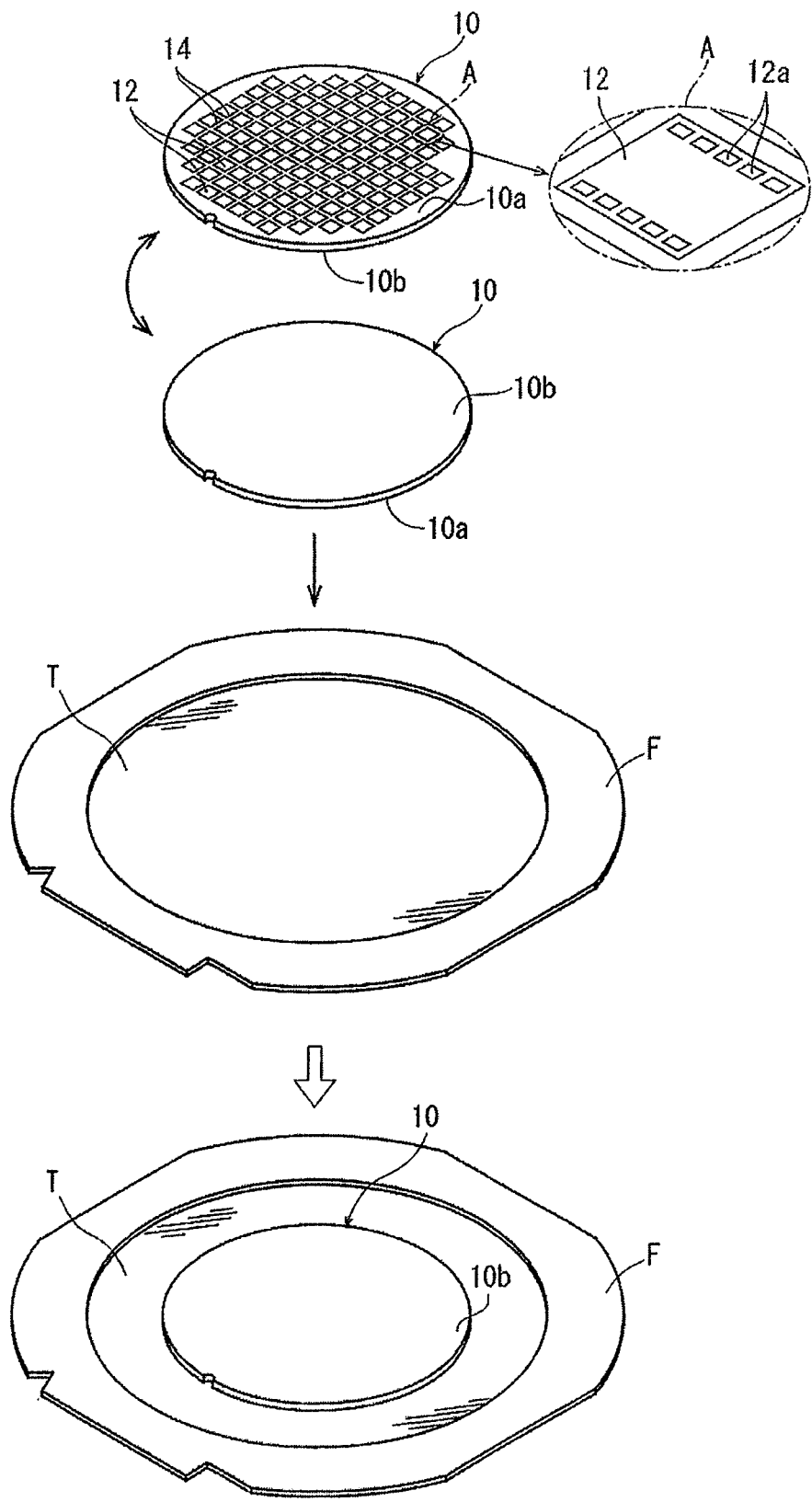
FIG. 1 is a perspective view of a substrate as a workpiece in an embodiment of the present invention, the view also illustrating a manner in which the substrate is supported on an annular frame.

A laser processing method according to an embodiment of the present invention will be described in detail below with reference to the accompanying drawings. FIG. 1 illustrates a perspective view of a disk-shaped substrate 10 according to an embodiment of the present invention, which is prepared as a workpiece to be processed by a laser beam. The substrate 10 illustrated in FIG. 1 has a front surface 10a and a back surface 10b, and is, for example, made of lithium tantalate (LT) with a thickness of 300 μm. The substrate 10 has a plurality of separate regions on the front surface 10a thereof that is demarcated by a grid pattern of dividing lines 14, with devices 12 formed in the separate respective regions. As illustrated in a portion A in FIG. 1 in an enlarged manner on the right side, each of the devices 12 has a plurality of electrode pads 12a, i.e., ten electrode pads 12a formed on a front surface thereof, each electrode pad 12a having a substantially rectangular shape. Each of the electrode pads 12a has a size of substantially 500 μm×600 μm, and is made of copper (Cu) according to the present embodiment. As illustrated in FIG. 1, the prepared substrate 10 is attached to a protective tape T mounted on an annular frame F with the front surface 10a facing downward and the back surface 10b facing upward, to be supported on the annular frame F through the protective tape T.

Figure 2:
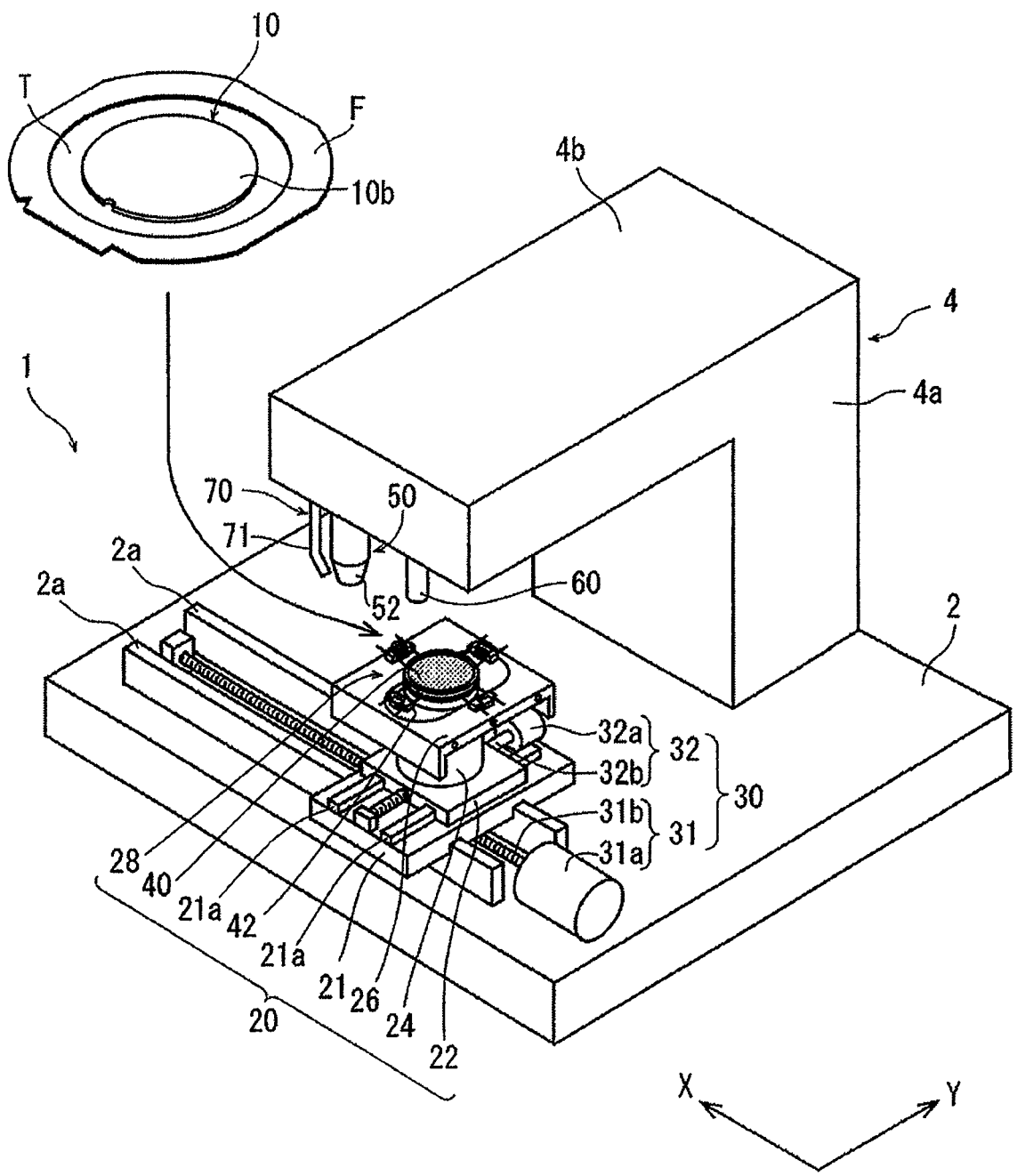
FIG. 2 is an overall perspective view of a laser processing apparatus that performs laser processing on the substrate illustrated in FIG. 1.

FIG. 2 illustrates an overall perspective view of a laser processing apparatus 1 that performs laser processing to the substrate 10 in order to from a fine hole in the present embodiment. The laser processing apparatus 1 includes a holding unit 20 for holding the substrate 10 supported on the annular frame F through the protective tape T, a moving mechanism 30 for moving the holding unit 20, a laser beam applying unit 50 for applying a laser beam to the substrate 10 held by the holding unit 20, an imaging unit 60 for capturing an image of the substrate 10 held by the holding unit 20, and plasma light detecting means 70 for detecting plasma light emitted from the substrate 10.

The holding unit 20 includes a rectangular X-axis direction movable plate 21 placed on a base table 2 for movement along X-axis directions indicated by an arrow X in FIG. 2, a rectangular Y-axis direction movable plate 22 placed on the X-axis direction movable plate 21 for movement along Y-axis directions indicated by an arrow Y that extend perpendicularly to the X-axis directions to define a substantially horizontal plane with the X-axis directions, a hollow cylindrical support post 24 fixedly mounted on an upper surface of the Y-axis direction movable plate 22, and a rectangular cover plate 26 fixed to an upper end of the support post 24. The cover plate 26 has an oblong hole defined therein, and a circular chuck table 28 is placed on the cover plate 26 in such a manner as to extend upwardly through the oblong hole of the cover plate 26. A circular suction chuck 40 that is made of a porous material and lies substantially horizontally is disposed on an upper surface of the chuck table 28. The suction chuck 40 is connected to suction means, not illustrated, through a passage extending through the support post 24. A plurality of clamps 42 for securing the annular frame F that supports the substrate 10 thereon is disposed on the chuck table 28.

The moving mechanism 30 is disposed on the base table 2 and functions as means for moving the holding unit 20 and the laser beam applying unit 50 relatively to each other. The moving mechanism 30 includes an X-axis moving mechanism 31 that processing-feeds the holding unit 20 in the X-axis directions and a Y-axis moving mechanism 32 that indexing-feeds the holding unit 20 in the Y-axis directions. The X-axis moving mechanism 31 converts rotary motion of a pulse motor 31a into linear motion through a ball screw 31b and transmits the linear motion to the X-axis direction movable plate 21, thereby moving the X-axis direction movable plate 21 in one of the X-axis directions or the other along a pair of guide rails 2a on the base table 2. The Y-axis moving mechanism 32 converts rotary motion of a pulse motor 32a into linear motion through a ball screw 32b and transmits the linear motion to the Y-axis direction movable plate 22, thereby moving the Y-axis direction movable plate 22 in one of the Y-axis directions or the other along a pair of guide rails 21a on the X-axis direction movable plate 21. Further, the rotary actuator means, not illustrated, is housed in the support post 24 and is configured to be able to control a position of the chuck table 28 by rotating the chuck table 28 about its own vertical axis at a given angle. Note that, although not illustrated, the X-axis moving mechanism 31, the Y-axis moving mechanism 32, and the rotary actuator means (not illustrated) are each provided with position detecting means. The position detecting means accurately detects a position along the X-axis directions, a position along the Y-axis directions, and a rotational position in a circumferential direction of the chuck table 28 on the base table 2, and the positions thus detected are transmitted to a control unit 100 (see FIG. 3) which will be described later. Based on the detected positions, the control unit 100 issues instruction signals to actuate the X-axis moving mechanism 31, the Y-axis moving mechanism 32, and the rotary actuator means (not illustrated) to control such that the respective positions of the chuck table 28 become a desired X-coordinate position, a desired Y-coordinate position, and a desired angular position θ.

A frame body 4 is mounted on the base table 2 in an upright manner laterally of the moving mechanism 30. The frame body 4 includes a vertical wall 4a disposed on the base table 2 and a horizontal wall 4b extending horizontally from an upper end portion of the vertical wall 4a to above the holding unit 20. The horizontal wall 4b of the frame body 4 houses therein an optical system, not illustrated, of the laser beam applying unit 50. The laser beam applying unit 50 includes a light condenser 52 disposed on a lower surface of a distal end portion of the horizontal wall 4b.

Figure 3:
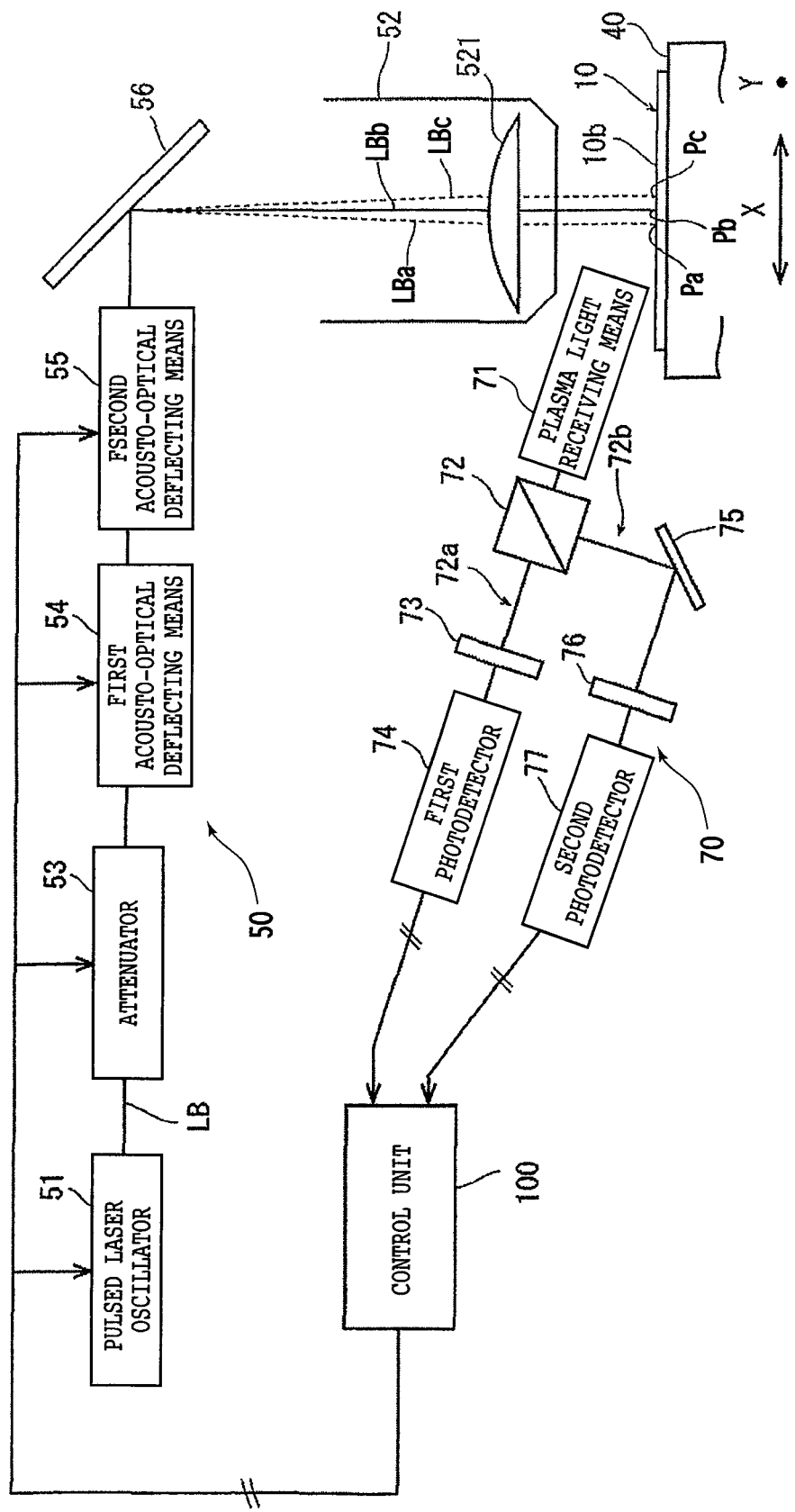
FIG. 3 is a block diagram illustrating schematic configurations of a laser beam applying unit and plasma light detecting means of the laser processing apparatus illustrated in FIG. 2.

As illustrated in FIG. 3, the laser beam applying unit 50 includes a pulsed laser oscillator 51, an attenuator 53, first acousto-optical deflecting means 54, second acousto-optical deflecting means 55, and a reflecting mirror 56. The pulsed laser oscillator 51 emits a pulsed laser beam LB. The attenuator 53 adjusts an output level of the pulsed laser beam LB emitted from the pulsed laser oscillator 51. The first acousto-optical deflecting means 54 includes at least an acousto-optical element as optical deflecting means for deflecting an optical path of the pulsed laser beam LB in a given one of processing-feed directions, i.e., the X-axis directions. The second acousto-optical deflecting means 55 includes at least an acousto-optical element as optical deflecting means for deflecting the optical path of the pulsed laser beam LB in a given one of indexing-feed directions, i.e., the Y-axis directions. The reflecting mirror 56 changes the direction of the optical path of the pulsed laser beam LB from the second acousto-optical deflecting means 55 to guide the pulsed laser beam LB reflected from the reflecting mirror 56 to the light condenser 52, which includes an fθ lens. The pulsed laser oscillator 51, the attenuator 53, the first acousto-optical deflecting means 54, and the second acousto-optical deflecting means 55 described above are connected to the control unit 100 and controlled by instruction signals transmitted from the control unit 100.

In a case where the control unit 100 applies a voltage of 5 V, for example, to the first acousto-optical deflecting means 54 and applies a frequency corresponding to 5 V to the acousto-optical element, not illustrated, of the first acousto-optical deflecting means 54, then the optical path of the pulsed laser beam LB emitted from the pulsed laser oscillator 51 is deflected to an optical path LBa, along which the pulsed laser beam LB travels and is focused on a focused spot Pa on the substrate 10 in FIG. 3. In a case where the control unit 100 applies a voltage of 10 V, for example, to the first acousto-optical deflecting means 54 and applies a frequency corresponding to 10 V to the acousto-optical element thereof, then the optical path of the pulsed laser beam LB emitted from the pulsed laser oscillator 51 is deflected to an optical path LBb, along which the pulsed laser beam LB travels and is focused on a focused spot Pb on the substrate 10 that is shifted by a predetermined amount from the focused spot Pa to the right in FIG. 3. In a case where the control unit 100 applies a voltage of 15 V, for example, to the first acousto-optical deflecting means 54 and applies a frequency corresponding to 15 V to the acousto-optical element thereof, then the optical path of the pulsed laser beam LB emitted from the pulsed laser oscillator 51 is deflected to an optical path LBc, along which the pulsed laser beam LB travels and is focused on a focused spot Pc on the substrate 10 that is further shifted by a predetermined amount from the focused spot Pb to the right in FIG. 3.

The second acousto-optical deflecting means 55 is different from the first acousto-optical deflecting means 54 described above only in that a deflecting direction of the optical path of the pulsed laser beam LB is in the indexing-feed directions, i.e., the Y-axis directions that are perpendicular to the sheet surface of FIG. 3. Otherwise, the second acousto-optical deflecting means 55 operates in the same manner as the first acousto-optical deflecting means 54. The pulsed laser beam LB can thus be deflected by the first acousto-optical deflecting means 54 and the second acousto-optical deflecting means 55 to any position within a predetermined range in the processing-feed directions, i.e., the X-axis directions, and the indexing-feed directions, i.e., the Y-axis directions, depending on the voltages applied thereto.

The control unit 100 includes a computer and includes a central processing unit (CPU) for executing processing operations in accordance with control programs, a read only memory (ROM) for storing control programs and the like, a readable/writable random access memory (RAM) for storing detected values, results of processing operations and the like, an input interface, and an output interface. Not only the laser beam applying unit 50, but also the moving mechanism 30, the imaging unit 60, the plasma light detecting means 70, and the like actuating means are connected to the control unit 100, and the respective actuating means can be controlled by the instruction signals from the control unit 100.

Returning back to FIG. 1, the imaging unit 60 is disposed on the lower surface of the distal end portion of the horizontal wall 4b at a position adjacent to the light condenser 52 in one of the X-axis directions. The imaging unit 60 includes a typical imaging element for capturing an image with a visible beam of light, illuminating means for illuminating a workpiece, an infrared imaging element, infrared ray applying means, and the like. Image information captured by the imaging unit 60 is transmitted to the control unit 100. The imaging unit 60 is used when positioning (alignment) between the substrate 10 and the light condenser 52 is carried out and also when a position of each of the electrode pads 12a formed on the devices 12 is detected, in carrying out laser processing.

The plasma light detecting means 70 has a main portion housed in the horizontal wall 4b of the frame body 4. The plasma light detecting means 70 includes plasma light receiving means 71 disposed on the lower surface of the distal end portion of the horizontal wall 4b at a position adjacent to the light condenser 52 in the X-axis direction that is opposite to the imaging unit 60 with the light condenser 52 interposed between the plasma light detecting means 70 and the imaging unit 60 (see FIG. 2). As illustrated in FIG. 3, the plasma light detecting means 70 includes the plasma light receiving means 71, a beam splitter 72, a first bandpass filter 73, a first photodetector 74, a direction changing mirror 75, a second bandpass filter 76, and a second photodetector 77. The plasma light receiving means 71 receives plasma light generated when the pulsed laser beam LB is applied from the light condenser 52 of the laser beam applying unit 50 to the substrate 10 held on the chuck table 40. The beam splitter 72 splits the plasma light received by the plasma light receiving means 71 into first plasma light to travel along a first optical path 72a and second plasma light to travel along a second optical path 72b. The first bandpass filter 73 is disposed in the first optical path 72a and passes only light having a first set wavelength (more specifically, the wavelength of the first plasma light that is emitted from lithium tantalate of which the substrate 10 is made). The first photodetector 74 detects the first plasma light that has passed through the first bandpass filter 73 and outputs a light intensity signal. The direction changing mirror 75 is disposed in the second optical path 72b. The second bandpass filter 76 is disposed in the second optical path 72b and passes only light a direction of which has been changed by the direction changing mirror 75 and having a second set wavelength (more specifically, the wavelength of the second plasma light emitted from copper of which the electrode pads 12a are made). The second photodetector 77 detects the second plasma light that has passed through the second bandpass filter 76 and outputs a light intensity signal. The plasma light receiving means 71 described above includes a condensing lens (not illustrated), and a lens case (not illustrated) that houses the condensing lens.

The first bandpass filter 73 described above is allowed to pass light in a wavelength range from 660 to 680 nm so as to pass only the wavelength, i.e., 670 nm, of the first plasma light emitted from lithium tantalate according to the present embodiment. In addition, the second bandpass filter 74 described above is allowed to pass light in a wavelength range from 510 to 520 nm so as to pass only the wavelength, i.e., 515 nm, of the second plasma light emitted from copper in the present embodiment. The first photodetector 74 and the second photodetector 77 output respective signals that are voltage values corresponding to the detected plasma light intensities to the control unit 100.

The laser processing apparatus 1 used in the present embodiment is generally configured as described above. A description will be given regarding laser processing according to the present embodiment which is carried out by use of the laser processing apparatus 1 described above to form a fine hole that reaches the electrode pads 12a from the back surface 10b of the substrate 10 at a position corresponding to each of the electrode pads 12a of each of the devices 12 formed on the substrate 10.

As described above, the substrate 10 is supported on the annular frame F through the protective tape T, with the back surface 10b facing upward. The substrate 10 is placed on the suction chuck 40 on the chuck table 28 of the laser processing apparatus 1 illustrated in FIG. 2 with the protective tape T facing downward. The suction means not illustrated is actuated to hold the substrate 10 under suction on the chuck table 28 through the protective tape T. The annular frame F is fixed to the chuck table 28 by the clamps 42.

The chuck table 28 with the substrate 10 held under suction thereon as described above is positioned directly below the imaging unit 60 by the X-axis moving mechanism 31. When the chuck table 28 is positioned directly below the imaging unit 60, it is confirmed whether or not the dividing lines 14 in a grid pattern on the substrate 10 held on the chuck table 28 are positioned parallel to the X-axis directions and the Y-axis directions, and the orientation of the substrate 10 is adjusted. Subsequently, an alignment is carried out by detecting coordinate positions of the electrode pads 12a formed on each of the devices 12 and setting an application position of the laser beam LB.

After the alignment has been finished, carried out is a laser beam applying step of applying the laser beam LB to the back surface 10b of the substrate 10 at a position corresponding to each of the electrode pads 12a from the back surface 10b side of the substrate 10.

(Laser Beam Applying Step)

After the alignment has been finished as described above, the laser beam applying step is carried out. The coordinate positions of the devices 12 of the substrate 10 held on the chuck table 28 and the electrode pads 12a have been stored in and managed by the control unit 100. As the alignment described above has been carried out, one of the electrode pads 12a on the substrate 10 can be positioned accurately in a desired position.

Figure 4:
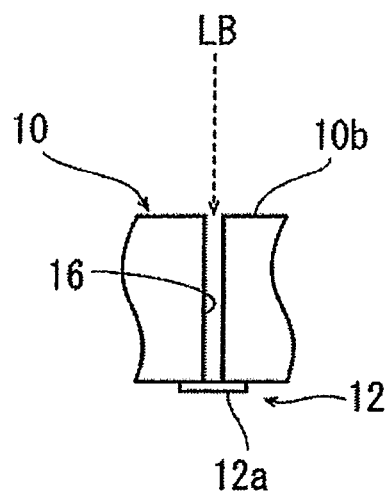
FIG. 4 is a partial enlarged cross-sectional view of the substrate illustrated in FIG. 1, the view illustrating a manner of forming a fine hole in the substrate by applying a laser beam from a back surface of the substrate in a laser beam applying step of the embodiment of the present invention.

In the laser beam applying step, the pulsed laser beam LB is applied to the substrate 10 under the following conditions:

Laser beam wavelength: 343 nm
Repetitive frequency: 50 kHz
Average output power: 1.5 W
Pulse energy: 30 µJ
Pulse width: 10 ps
Spot diameter: 50 µm Under the laser processing conditions described above, a peak power density of the laser beam to be applied in the laser beam applying step is adjusted to 150 GW/cm$^2$. In this setting, the first acousto-optical deflecting means 54 and the second acousto-optical deflecting means 55 are appropriately controlled, so that the laser beam LB is applied to the back surface 10b of the substrate 10 at a position corresponding to a predetermined one of the electrode pads 12a from the back surface 10b side thereof to form a fine hole 16 as illustrated in FIG. 4.

(Detecting Step)

At the same time that the laser beam applying step described above is carried out, a detecting step is carried out to detect the first plasma light emitted from lithium tantalate of which the substrate 10 is made and the second plasma light emitted from copper of which the electrode pads 12 are made. The detecting step will be described below.

Figure 5:
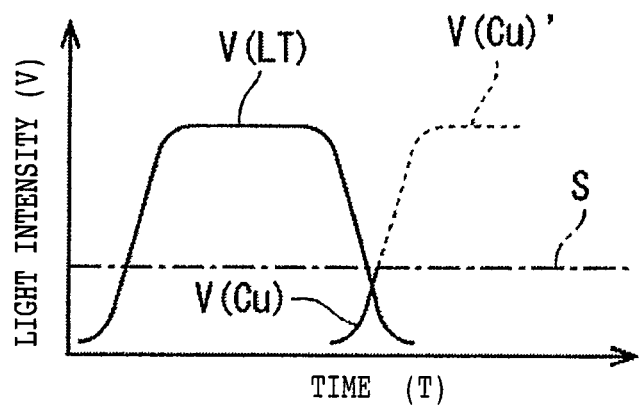
FIG. 5 is a graph indicating change in output, i.e., voltage values, of a first photodetector and a second photodetector.

In the detecting step, in a state in which the laser beam applying step described above is being carried out, the first photodetector 74 and the second photodetector 77 of the plasma light detecting means 70 output respective voltage values corresponding to light intensity signals to the control unit 100. FIG. 5 illustrates the voltage value V (LT) output from the first photodetector 74 that detects the light intensity of the first plasma light and the voltage value V (Cu) output from the second photodetector 77 that detects the light intensity of the second plasma light, as they vary over time. In FIG. 5, the horizontal axis indicates time (T) and the vertical axis indicates the voltage value (V) corresponding to the light intensity.

When the laser beam LB starts being applied to the back surface 10b of the substrate 10 at a position corresponding to the electrode pads 12a described above from the back surface 10b side of the substrate 10, the substrate 10 emits the first plasma light by being irradiated with the laser beam LB. As illustrated in FIG. 5, the voltage value V (LT) output from the first photodetector 74 starts to rise to a predetermined voltage value, for example, 2.5 V. Then, the voltage value V (LT) remains substantially the predetermined voltage value over time until the laser beam LB reaches the electrode pad 12a. Thereafter, when the laser beam LB reaches the electrode pad 12a, the voltage value V (LT) output from the first photodetector 74 starts to fall.

(Laser Beam Irradiation Finishing Step)

According to the detecting step described above, it is possible to detect a state of generation of each of the first plasma light and the second plasma light. Upon detection of the second plasma light in the detecting step, a laser beam irradiation finishing step is carried out to stop application of the laser beam LB to the substrate 10. The laser beam irradiation finishing step will be described in more detail below.

When the laser beam LB reaches the electrode pad 12a, the voltage value V (Cu) output from the second photodetector 77 starts to rise, as illustrated in FIG. 5. Immediately after the voltage value V (Cu) has started to rise, however, the fine hole 16 may not have fully extended with respect to the electrode pad 12a. If the fine hole 16 that is not fully developed is filled up with an electrically conductive material, then the resultant via hole may possibly cause a conduction failure. In order to cope with such a risk, according to the present embodiment, a threshold value S, for example, 1.0 V, is set for the voltage value V (Cu) to be output from the second photodetector 77 in order to detect that the fine hole 16 has reached the electrode pad 12a over a sufficient region. The control unit 100 compares the voltage value V (Cu) to be output from the second photodetector 77 with the threshold value S. If the control unit 100 determines that the voltage value V (Cu) has exceeded the threshold value S, then the control unit 100 decides that the fine hole 16 has reached the electrode pad 12a over a sufficient region and the fine hole 16 has been formed properly, and then, sends a stop signal to the laser beam applying unit 50 to finish applying the pulsed laser beam LB. If the laser beam applying step is continued without carrying out the above determining process using the threshold value S, then the voltage value V (Cu)' further rises to a substantially constant voltage value, for example, 2.5 V and remains substantially constant as illustrated by a broken line as the voltage value of 2.5 V over time. However, the voltage value V (Cu) that has risen to the substantially constant voltage value, for example, 2.5 V, is strong enough to form a through hole in the electrode pad 12a. Therefore, the threshold value S is set to be lower than the substantially constant voltage value, for example, 2.5 V.

As described above, the laser beam applying step, the detecting step, and the laser beam irradiation finishing step are carried out while process-feeding the chuck table 28 in the X-axis direction by the X-axis moving mechanism 31 to form a proper fine hole 16 at a position corresponding to one electrode pad 12a so as to reach the electrode pad 12a. Then, it is determined whether or not a next electrode pad 12a adjacent to the electrode pad 12a which has been processed is positioned in the X-axis direction under an irradiation region of the laser beam LB immediately below the light condenser 52. If it is determined that the next electrode pad 12a has been positioned under the irradiation region of the laser beam LB, the laser beam applying step, the detecting step, and the laser beam irradiation finishing step same as those described above are carried out again. The series of above processes is repeated until proper fine holes 16 are formed in the substrate 10 at respective positions corresponding to all the electrode pads 12a arrayed in the X-axis direction. When the fine holes 16 have been formed in the substrate 10 at the respective positions corresponding to all the electrode pads 12a arrayed in the X-axis direction, the Y-axis moving mechanism 32 is actuated to indexing-feed the substrate 10 in one of the Y-axis directions. Then, the laser beam applying step, the detecting step, and the laser beam irradiation finishing step same as those described above are repeated on a next array of electrode pads 12a adjacent in the Y-axis direction to form proper fine holes 16 in the substrate 10 at respective positions corresponding to the electrode pads 12a in the next array. The series of above processes is similarly repeated until proper fine holes 16 are formed in the substrate 10 at respective positions corresponding to all the electrode pads 12a formed on the substrate 10.

As described above, in the present embodiment, the peak power density of the laser beam to be applied in the laser beam applying step described above is adjusted to 150 GW/cm$^2$. This setting of the peak power density of the laser beam is based on knowledge that the peak power density of the laser beam to be applied in the laser beam applying step is required to set in a range from 175 GW/cm$^2$ or less to 100 GW/cm$^2$ or more according to the technical idea of the present invention. Grounds of setting such condition for the peak power density will be described below.

The inventors of the present invention conducted experiments described below in order to examine a proper peak power density of a laser beam for forming a proper fine hole 16 by applying the laser beam LB to the back surface 10b of the substrate 10 from the back surface 10b side thereof at a position corresponding to an electrode pad 12a. Results of the experiments conducted will be described below with reference to the table in FIG. 6. In the experiments, the laser beam LB was applied to the back surface 10b of the substrate 10 at a position corresponding to a predetermined one of the electrode pads 12a by the laser beam applying unit 50 from the back surface 10b side of the substrate 10. The peak power density of the laser beam LB was varied to obtain a processing result corresponding to each peak power density of the laser beam LB as illustrated in FIG. 6. Note that the processing conditions other than variable parameters indicated in the respective experiments were in accordance with the laser processing conditions (basic condition) below in the similar manner to the present embodiment described above. Consequently, those other than the processing steps and the basic condition will not be described in detail below. In addition, "poor" in the processing results indicates that processing was defective, "good" indicates that processing was favorably carried out, "excellent" indicates that processing was extremely favorable. The processing results were determined on the basis of a state of the electrode pad 12a when the second plasma light was detected and then application of the laser beam LB was stopped.

The laser processing conditions (basic condition) serving as a reference in the experiments are as follows.

Pulsed laser beam wavelength: 343 nm

Repetitive frequency: 50 kHz (repetitive frequency as a reference)

Average output power: 3 W

Pulse energy: 60 μJ

Pulse width: 10 ps

Spot diameter: 50 μm

Peak power density: 300 GW/cm$^2$

<Experiment 1>

In accordance with the above laser processing conditions (basic condition: average output power of 3 W, pulse energy of 60 μJ, peak power density of 300 GW/cm$^2$), laser processing was carried out. When the second plasma light was detected, application of the laser beam LB was stopped. As a result, a hole was opened in the electrode pad 12a (processing result was poor).

<Experiment 2>

The basic laser processing condition described above was adjusted such that the average output power was 2.5 W, the pulse energy was 50 μJ, and the peak power density was 250 GW/cm$^2$, and the laser processing was carried out. When the second plasma light was detected, application of the laser beam LB was stopped. As a result, a hole was opened in the electrode pad 12a (processing result was poor).

<Experiment 3>

The basic laser processing condition described above was adjusted such that the average output power was 2 W, the pulse energy was 40 μJ, and the peak power density was 200 GW/cm$^2$, and the laser processing was carried out. When the second plasma light was detected, application of the laser beam LB was stopped. As a result, a hole was not opened in the electrode pad 12a, but a large recess in the electrode pad 12a was observed (processing result was poor).

<Experiment 4>

The basic laser processing condition described above was adjusted such that the average output power was 1.75 W, the pulse energy was 35 μJ, and the peak power density was 175 GW/cm$^2$, and the laser processing was carried out. When the second plasma light was detected, application of the laser beam LB was stopped. As a result, a small recess in the electrode pad 12a was observed, but a hole was not opened in the electrode pad 12a (processing result was good).

<Experiment 5>

The basic laser processing condition described above was adjusted such that the average output power was 1.5 W, the pulse energy was 30 μJ, and the peak power density was 150 GW/cm$^2$, and the laser processing was carried out. When the second plasma light was detected, application of the laser beam LB was stopped. As a result, no recess in the electrode pad 12a was observed, and no hole was opened in the electrode pad 12a (processing result was excellent).

<Experiment 6>

The basic laser processing condition described above was adjusted such that the average output power was 1.25 W, the pulse energy was 25 μJ, and the peak power density was 125 GW/cm$^2$, and the laser processing was carried out. When the second plasma light was detected, application of the laser beam LB was stopped. As a result, no recess in the electrode pad 12a was observed, and no hole was opened in the electrode pad 12a (processing result was excellent).

<Experiment 7>

The basic laser processing condition described above was adjusted such that the average output power was 1 W, the pulse energy was 20 μJ, and the peak power density was 100 GW/cm$^2$, and the laser processing was carried out. When the second plasma light was detected, application of the laser beam LB was stopped. As a result, no recess in the electrode pad 12a was observed, and no hole was opened in the electrode pad 12a; however, compared to Experiment 5, it took twice or longer than the processing time in Experiment 5 until application of the laser beam LB was stopped (processing result was good).

<Experiment 8>

The basic laser processing condition described above was adjusted such that the average output power was 0.75 W, the pulse energy was 15 µJ, and the peak power density was 75 GW/cm$^2$, and the laser processing was carried out. However, the file hole 16 did not reach the electrode pad 12a in a practical period of time for processing, and the second plasma light was not detected (processing result was poor).

<Conclusion>

From the above results of the experiments (see FIG. 6), the present inventors have found that, by setting the peak power density of the laser beam to be applied in the laser beam applying step in a range from 175 GW/cm$^2$ or less to 100 GW/cm$^2$ or more, it is possible to apply the laser beam LB to the substrate 10 without being interfered by the plasma light generated by the earlier laser beam which has been applied primarily, to thereby securely detect the latest plasma light which is applied secondarily, so that the fine hole 16 can be properly formed. Further, the present inventors have found that, by setting the peak power density of the laser beam to be applied in the laser beam applying step in a range from 150 GW/cm$^2$ or less to 125 GW/cm$^2$ or more, it is possible to properly determine, from the detection of the plasma light, that the fine hole 16 reaches the electrode pad 12a without generation of any recess in the electrode pad 12a, to thereby form the fine hole 16 in better quality.

In the embodiment described above, an example in which the substrate 10 is made of lithium tantalate has been given. However, the present invention is not limited to this example. The substrate 10 may be made of any of other materials including silicon, lithium niobate (LN), glass, and the like. In a case the substrate 10 is made of any of those other materials, since the wavelength of the first plasma light varies depending on a material of the substrate 10 to be adopted, in order to cope with this variation in wavelength, a wavelength band in which the first plasma light is allowed to pass through the beam splitter 72 and the first bandpass filter 73 is adjusted accordingly. Note that the electrode pads 12a are generally made of copper. However, the present invention does not exclude other materials including gold and the like, for example, as the material of the electrode pads 12a. In a case where the electrode pads 12a are made of any of those other materials, a wavelength band in which the second plasma light is allowed to pass through the second bandpass filter 76 may be adjusted depending on a metal of the electrode pads 12a to be adopted, as with the case of the first bandpass filter 73.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method for applying a laser beam to a back surface of a substrate with a device formed on a front surface thereof and including an electrode pad, to form a fine hole in the substrate that reaches the electrode pad, the method comprising:

a laser beam applying step of applying the laser beam to the back surface of the substrate to form a fine hole in the substrate at a position corresponding to the electrode pad;

a detecting step of detecting, through a first optical path, first plasma light having a first wavelength emitted from the substrate at the same time that the fine hole is formed in the substrate by the laser beam applied thereto; and, through a second optical path, second plasma light having a second wavelength different from the first wavelength emitted from the electrode pad; and a laser beam irradiation finishing step of stopping application of the laser beam when the second plasma light is detected in the detecting step, wherein, in the laser beam applying step, a peak power density of the laser beam to be applied is set in a range from 175 GW/cm$^2$ or less to 100 GW/cm$^2$ or more.

2. The laser processing method according to claim 1, wherein, in the laser beam applying step, a peak power density of the laser beam to be applied is set in a range from 150 GW/cm$^2$ or less to 125 GW/cm$^2$ or more.

3. The laser processing method according to claim 1, wherein the first wavelength is in a range from approximately 660 nm to 680 nm, and the second wavelength is in a range from approximately 510 nm to 520 nm.

4. The laser processing method according to claim 1, wherein the first wavelength is approximately 670 nm, and the second wavelength is approximately 515 nm.

5. The laser processing method according to claim 1, wherein the laser beam irradiation finishing step further comprises, determining a light intensity of the second wavelength and stopping the application of the laser beam when the light intensity reaches a threshold value.

* * * * *